(12) United States Patent
Lau et al.

(10) Patent No.: US 10,741,434 B2
(45) Date of Patent: Aug. 11, 2020

(54) APPARATUS FOR PACKING ULTRA-SMALL ELECTRONIC DEVICES

(71) Applicant: ASM Technology Singapore Pte Ltd, Singapore (SG)

(72) Inventors: Kai Fung Lau, Hong Kong (HK); Chi Wah Cheng, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 150 days.

(21) Appl. No.: 16/139,750

(22) Filed: Sep. 24, 2018

(65) Prior Publication Data
US 2020/0098614 A1   Mar. 26, 2020

(51) Int. Cl.
*H05K 13/04* (2006.01)
*H05K 13/08* (2006.01)
*H01L 21/68* (2006.01)
*H01L 21/677* (2006.01)
*H01L 21/683* (2006.01)
*B65B 15/04* (2006.01)

(52) U.S. Cl.
CPC ............ *H01L 21/681* (2013.01); *B65B 15/04* (2013.01); *H01L 21/67766* (2013.01); *H01L 21/6836* (2013.01); *H05K 13/0413* (2013.01); *H05K 13/0419* (2018.08); *H05K 13/0812* (2018.08)

(58) Field of Classification Search
CPC ............................ H05K 13/0812; B65B 15/04
See application file for complete search history.

(56) References Cited

U.S. PATENT DOCUMENTS

| | | | |
|---|---|---|---|
| 5,588,195 A * | 12/1996 | Asai | H05K 13/0413 29/33 M |
| 5,671,527 A * | 9/1997 | Asai | H05K 13/0413 29/740 |
| 6,481,187 B1 * | 11/2002 | Behnke | B07C 5/02 53/250 |
| 6,619,526 B1 * | 9/2003 | Souder, Jr. | B65H 20/22 226/151 |
| 2008/0004746 A1 * | 1/2008 | Jahnke | B65H 23/1884 700/229 |
| 2016/0249499 A1 * | 8/2016 | Sumi | H05K 13/0417 |
| 2018/0303015 A1 * | 10/2018 | Koch | H01L 21/6835 |
| 2018/0334334 A1 * | 11/2018 | Tago | G01R 31/2813 |

FOREIGN PATENT DOCUMENTS

TW         201607842 A    3/2016

* cited by examiner

*Primary Examiner* — Thomas Randazzo
(74) *Attorney, Agent, or Firm* — Ostrolenk Faber LLP

(57) ABSTRACT

An apparatus for placing ultra-small electronic devices into pockets on a carrier tape for packing has at least one holding element, a movement mechanism, a conveying mechanism and a positioning mechanism. The positioning mechanism further includes first and second positioning devices coupled to the conveying mechanism, wherein the second positioning device is mounted on the first positioning device. In use, the conveying mechanism conveys the carrier tape to move each pocket to a receiving position and the movement mechanism moves each holding element to place the electronic device into a respective pocket at the receiving position. The positioning mechanism adjusts a relative position between the electronic device and the respective pocket by adjusting the carrier tape, the first and second positioning devices being for coarse and fine positioning of the conveying mechanism respectively.

14 Claims, 9 Drawing Sheets

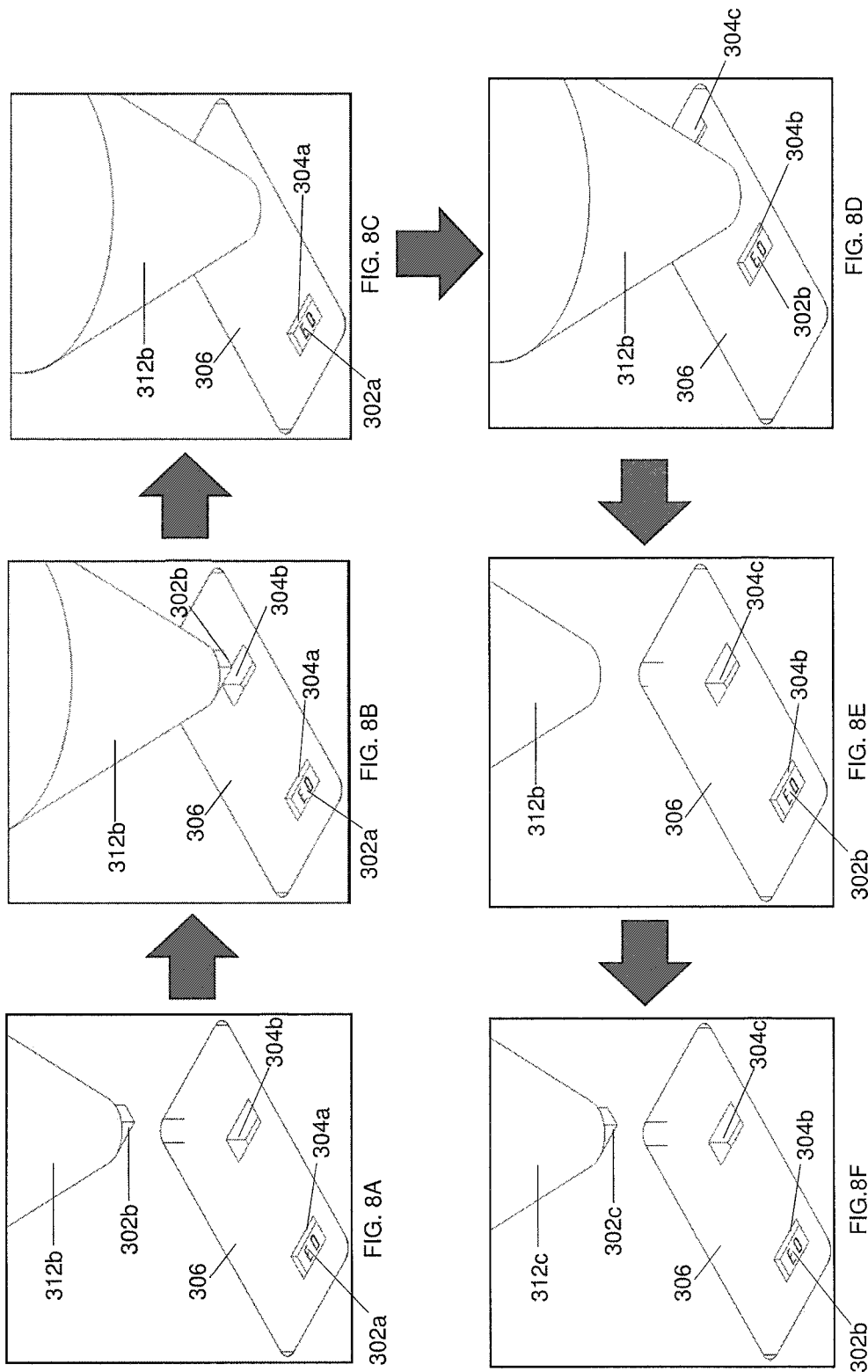

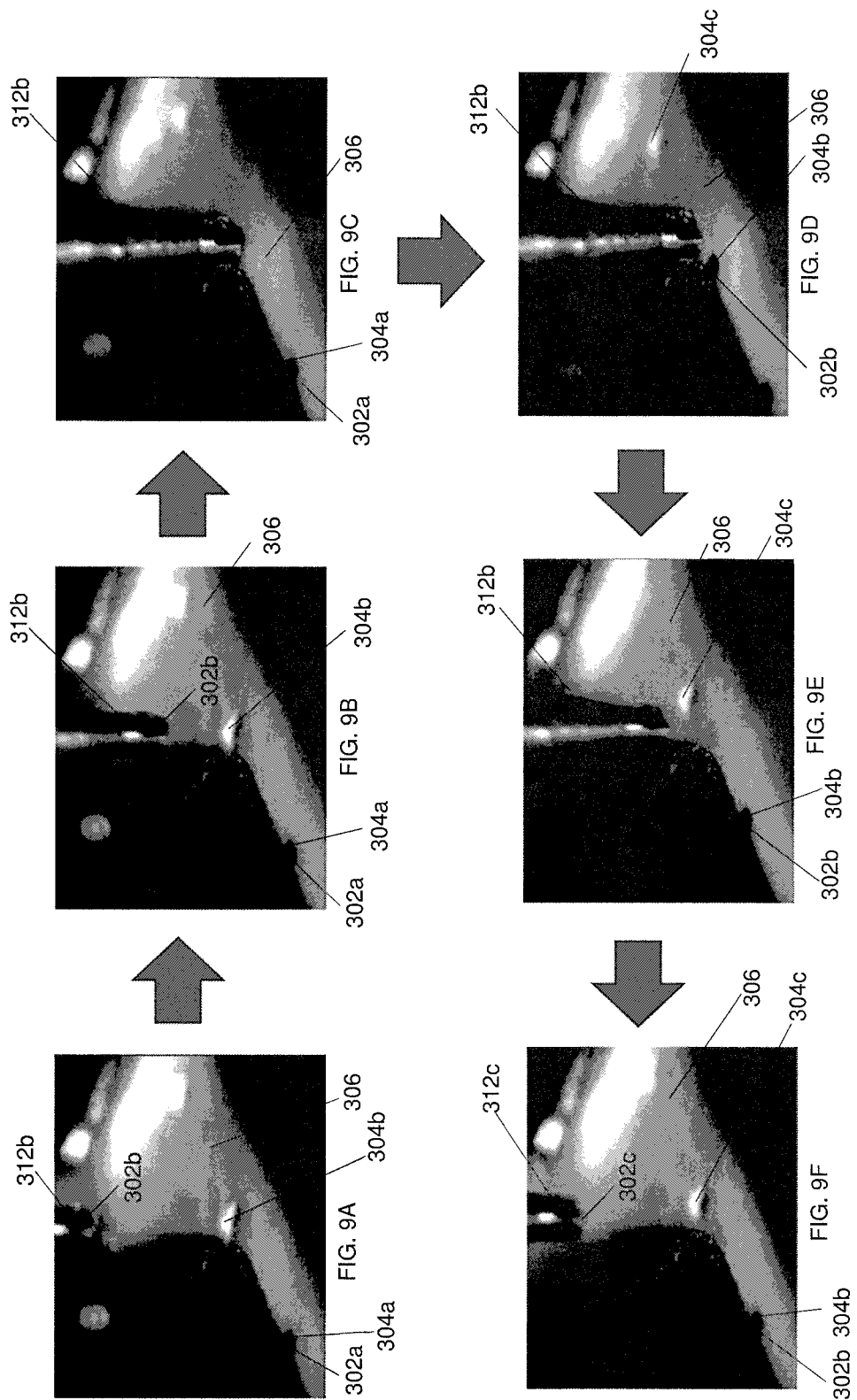

APPARATUS FOR PACKING ULTRA-SMALL ELECTRONIC DEVICES

FIELD OF THE INVENTION

The present invention relates to an apparatus for placing ultra-small electronic devices, such as wafer level packages, into pockets on a carrier tape for packing.

BACKGROUND OF THE INVENTION

Ultra-small electronic devices are usually packed by placing them into respective pockets of a carrier tape. This packing process often requires high precision as there tends to be little clearance between the walls of each pocket and the device to be placed into the pocket. This is especially so for certain types of devices such as devices with dimensions of 0.6 mm by 0.3 mm, or 0.4 mm by 0.2 mm (typically referred to as 0603 or 0402 respectively). In fact, the clearance may sometimes be smaller than the positional tolerance of the carrier tape. The clearance is even smaller if the carrier tape is in the form of a paper tape having pockets with straight vertical walls.

To facilitate packing of ultra-small electronic devices, prior art methods have been developed to improve the alignment of each electronic device with the respective pocket before placing the device into the pocket.

One example of such a prior art method is described in TW201607842. In TW201607842, a carrier tape having multiple pockets is conveyed by two sprockets, and a main body supports the sprockets together with the carrier tape. An imaging unit is used to capture an image of the pocket and the captured image is analysed to determine the offset in the position and orientation of the pocket relative to a reference position and orientation. A correction unit then moves the main body along an X-Y plane and rotates the main body about a Z axis. This in turn moves the pocket of the carrier tape to compensate for the determined offset. The alignment between the pocket and the electronic device to be placed into the pocket is hence improved.

FIG. 1 and FIG. 2 show a prior art apparatus 100 for packing ultra-small electronic devices 102. In FIG. 1 and FIG. 2, the carrier tape 104 is supported by an index wheel, which is in turn supported by a main body (the main body and index wheel are not shown in FIG. 1 and FIG. 2). The apparatus 100 comprises a turret 106 having a plurality of pick heads 108 for holding respective electronic devices 102. Each pick head 108 is moved sequentially through a series of stations, including a precising station and an imaging station. Referring to FIG. 1, at the precising station, a precising mechanism in the form of a precisor re-orientator 110 is used to adjust an orientation of the electronic device 102 to correct angular displacement errors, and at the imaging station, a vision camera in the form of an up-look camera 112 is used to capture an image of each pick head 108 (hence, an image of the electronic device 102 held by the pick head 108). The apparatus 100 further comprises a pocket alignment inspection camera in the form of a down-look camera 114 attached to the turret 106. Referring to FIG. 2, the up-look camera 112 captures an image of the electronic device 102 held by the pick head 108. The down-look camera 114 is positioned over the carrier tape 104, and captures an image of the carrier tape 104 (hence, capturing an image of the pocket 116 which the next electronic device 102 is to be placed into). Using the captured images, an expected offset in the relative position of the electronic device 102 and the pocket 116 which the electronic device 102 is to be placed into is calculated. An X-Y table 118 then moves the main body in the X-Y plane to adjust a position of the carrier tape 104 based on the calculated offset. This improves the alignment between the electronic device 102 and the pocket 116 the device 102 is to be placed into.

Although the prior art methods described above are able to improve the alignment between the electronic devices and the respective pockets, the time taken to adjust the relative position between each device and the respective pocket is relatively long. This is because the correcting mechanism (such as the correction unit in TW201607842 and the X-Y table 118 of the apparatus 100) usually carries a heavy load and therefore, tends to move at a low speed. Furthermore, the main body moved by the correcting mechanism is also heavy. As a result, the improvement in alignment between the electronic devices and the respective pockets is often at the expense of reduced system throughput.

SUMMARY OF THE INVENTION

The present invention aims to provide a new and useful apparatus for packing ultra-small electronic devices.

According to an aspect of the present invention, there is provided an apparatus for placing ultra-small electronic devices into pockets on a carrier tape for packing, the apparatus comprising: at least one holding element configured to hold an electronic device; a movement mechanism configured to move each holding element to pick up the electronic device and to place the electronic device into a respective pocket on the carrier tape; a conveying mechanism configured to support and convey the carrier tape to move each pocket to a receiving position, where the electronic device is placed by the at least one holding element into a respective pocket located at the receiving position; and a positioning mechanism coupled to the conveying mechanism, the positioning mechanism being operative to adjust a relative position between each electronic device and the respective pocket by adjusting the carrier tape prior to placing the electronic device into the respective pocket; wherein the positioning mechanism comprises a first positioning device for coarse positioning of the conveying mechanism and a second positioning device mounted on the first positioning device for fine positioning of the conveying mechanism, the second positioning device being configured to position the conveying mechanism with greater precision than the first positioning device.

By providing the above-mentioned second positioning device, the precision of the first positioning device can be reduced. Coarse positioning can be performed by the first positioning device and the positioning errors arising from the coarse positioning can be compensated using the second positioning device mounted on the first positioning device. Hence, the total indexing time of the first positioning device can be greatly shortened. Therefore, the time taken in aligning each electronic device and the respective pocket can be greatly reduced. Accordingly, the alignment process can be performed without causing a substantial reduction in the system throughput. Compared to prior art apparatuses such as those described above, the apparatus comprising the first and second positioning devices can achieve the same amount of improvement in the alignment between the electronic devices and the respective pockets, but with an increased system throughput.

The first and second positioning devices may be movable simultaneously and independently of each other. This allows coarse and fine adjustments to be performed at the same time in either the same direction or different directions, therefore further reducing the amount of time taken in aligning each electronic device and the respective pocket.

A weight of the first positioning device may be heavier than a weight of the second positioning device. This allows the second positioning device to move and settle much faster, in turn achieving a further reduction in the amount of time taken in aligning each electronic device and the respective pocket.

The first and second positioning devices may be configured to move first and second portions of the apparatus, a weight of the first portion being heavier than a weight of the second portion. This allows the second portion to be moved faster, hence allowing the electronic device and the respective pocket to be aligned faster. The second portion may be comprised in and may be a subset of the first portion. For example, the second positioning device may be configured to adjust a position of the conveying mechanism independently of the first positioning device.

The second positioning device may comprise a first actuator configured to move the conveying mechanism along an axis perpendicular to the conveying axis. This helps to adjust a position of the pocket along the axis perpendicular to the conveying axis.

The second positioning device may further comprise a linkage, and the first actuator may be configured to move the linkage to move the conveying mechanism along the axis perpendicular to the conveying axis. The linkage may comprise a linkage element and a hinge, and the first actuator may be configured to rotate the linkage element about the hinge to move the conveying mechanism. By employing the lever principle, the amount of force required to move the conveying mechanism can be reduced.

The second positioning device may comprise a second actuator operative to actuate the conveying mechanism for adjusting a position of the respective pocket along the conveying axis. The apparatus may further comprise a pivot configured to support the conveying mechanism when the second actuator urges the conveying mechanism to swing about the pivot in a first rotational direction for adjusting a position of the respective pocket along the conveying axis. This requires less energy than driving the conveying mechanism with the motor.

The apparatus may further comprise a support element for biasing the conveying mechanism in the first rotational direction, and the second actuator may be operative to move the support element away from the conveying mechanism to cause the conveying mechanism to swing about the pivot in a second rotational direction opposite to the first rotational direction. Instead of configuring the second actuator to pull the conveying mechanism in the second rotational direction, retracting the support element requires less force. This also helps to simplify the manufacturing of the apparatus.

The apparatus may further comprise an imaging system configured to capture an image of each holding element and an image of each pocket and a processor operative to calculate an offset between each pocket and the respective electronic device using the captured images. The positioning mechanism may be configured to adjust a position of each pocket relative to the respective electronic device based on the calculated offset between the pocket and the respective electronic device. This allows the adjustment to be more accurate, hence improving the alignment between each pocket and the respective electronic device.

If the processor determines that the offset is less than a predetermined threshold, only the second positioning device but not the first positioning device may be operative to adjust the position of the pocket relative to the respective electronic device. This helps to reduce the total amount of energy expended in aligning the electronic devices with the respective pockets. In addition, reducing the frequency of using the first positioning device helps to reduce the wear and tear of the first positioning device, in turn lowering the maintenance costs of the apparatus.

BRIEF DESCRIPTION OF THE FIGURES

Embodiments of the invention will now be illustrated for the sake of example only with reference to the following drawings, in which:

FIG. 8A-FIG. 8F show magnified views of a part of the apparatus of FIG. 3 at different steps of placing an electronic device into a respective pocket; and FIG. 9A-FIG. 9F show photos of the magnified views of FIG. 8A-FIG. 8F captured by a high-speed camera.

DETAILED DESCRIPTION OF THE EMBODIMENTS

Figure 1:
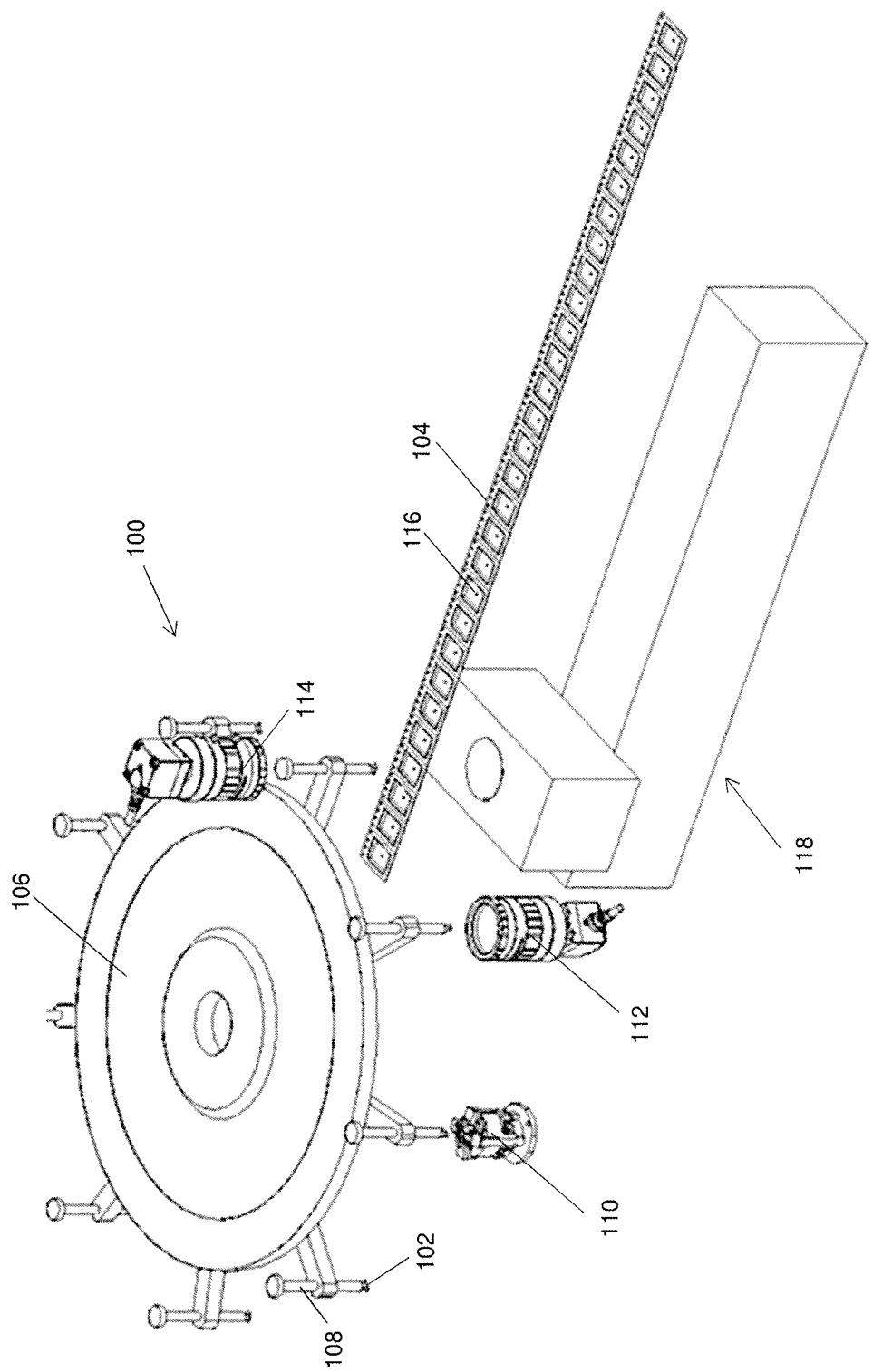
FIG. 1 shows a perspective view of a prior art apparatus for packing ultra-small electronic devices at one step of an operation of the prior art apparatus.
Figure 2:
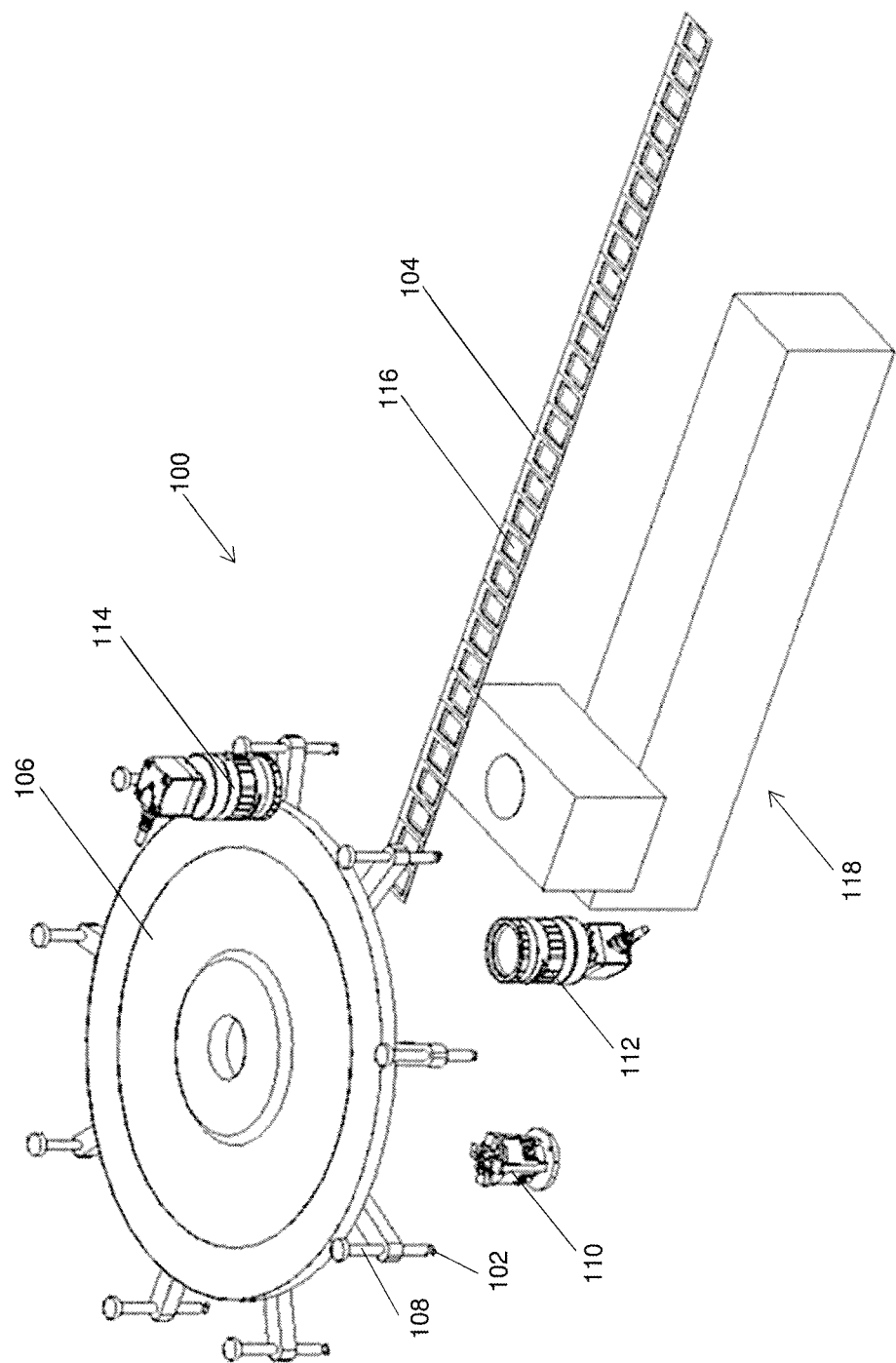
FIG. 2 shows a perspective view of the prior art apparatus of FIG. 1 at another step of the operation of the prior art apparatus.
Figure 3:
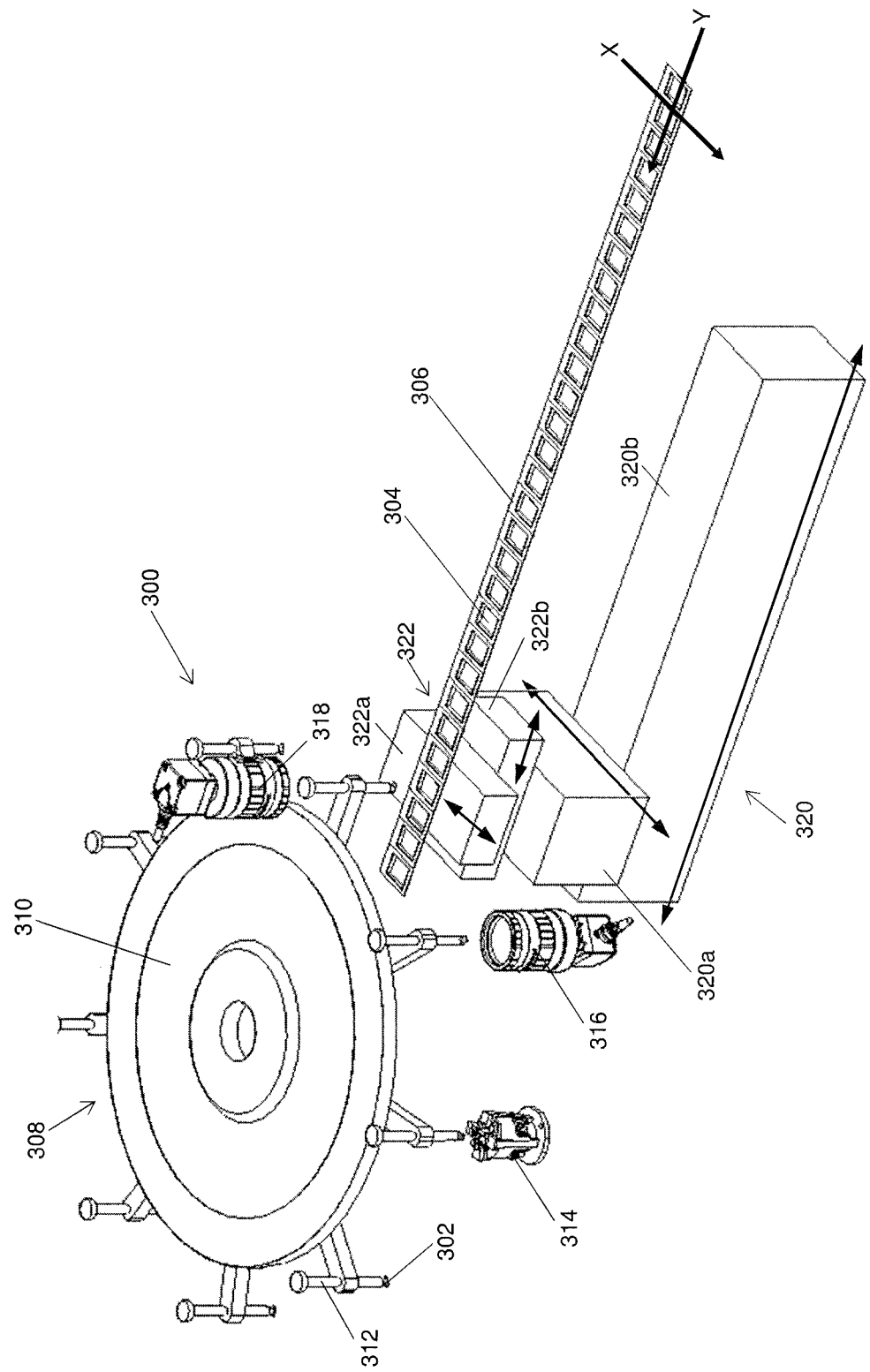
FIG. 3 shows a perspective view of an apparatus for packing ultra-small electronic devices according to an embodiment of the present invention.

FIG. 3 shows a perspective view of an apparatus 300 for packing ultra-small electronic devices 302 according to an embodiment of the present invention. In particular, the electronic devices 302 are packed by placing the devices 302 into respective pockets 304 of a carrier tape 306.

The apparatus 300 comprises a first movement mechanism in the form of a turret 308. The turret 308 includes a rotating mechanism in the form of a circular turret body 310 and a plurality of holding elements in the form of pick heads 312. The pick heads 312 are attached to the circular turret body 310, and are distributed, evenly spaced apart from each other, around the circumference of the body 310. Each pick head 312 has a collet configured to hold an electronic device 302. The circular turret body 310 is configured to rotate to move each pick head 312 sequentially through a series of stations, including a precising station and an imaging station.

The apparatus 300 further comprises a precising mechanism in the form of a precisor re-orientator 314 at the precising station. The precisor re-orientator 314 is configured to adjust an orientation of the electronic device 302 to correct angular displacement errors. An imaging system comprising a first imaging device in the form of an up-look camera 316 and a second imaging device in the form of a down-look camera 318 is also provided. The up-look camera 316 is located below the turret 308 at the imaging station and is configured to capture an image of each pick head 312, thereby capturing an image of the electronic device 302 held by the pick head 312. The down-look camera 318 is attached to a top surface of the circular turret body 310 such that the down-look camera 318 overhangs from the body 310. The down-look camera 318 is configured to capture an image of each pocket 304 of the carrier tape 306. Although not shown in FIG. 3, the apparatus 300 further comprises a processor configured to calculate an offset in position between the electronic device 302 and the respective pocket 304 the electronic device 302 is to be placed into. This calculation is done using the images captured by the up-look and down-look cameras 316, 318.

The circular turret body 310 is further configured to rotate to move each pick head 312 to a packing position above the carrier tape 306. The apparatus comprises a second movement mechanism (not shown in the figures) configured to move each pick head 312 at the packing position downwards from a first position to a second position, so as to place the electronic device 302 into the respective pocket 304 of the carrier tape 306 at the second position.

The apparatus 300 further comprises a positioning mechanism configured to adjust a relative position between each electronic device 302 and the respective pocket 304, more specifically, adjust a position of each pocket 304 relative to the respective electronic device 302 by adjusting the carrier tape 306, prior to placing the electronic device 302 into the pocket 304. As shown in FIG. 3, the positioning mechanism comprises a first positioning device 320 and a second positioning device 322 mounted on the first positioning device 320. The term "mounted on" herein shall not be interpreted in a limiting way. For example, the second positioning device 322 need not be directly in contact with the first positioning device 320. Further, the second positioning device 322 need not be above the first positioning device 320. It is sufficient as long as movement of the first positioning device 320 through a distance carries the second positioning device 322 through the same distance as well.

The first positioning device 320 is in the form of a full stroke X-Y table, whereas the second positioning device 322 is in the form of a short stroke mechanism. In other words, the first positioning device 320 is configured to provide adjustments over a greater distance (full stroke) as compared to the second positioning device 322 (short stroke). As shown in FIG. 3, the first positioning device 320 includes a first full stroke unit 320a for adjusting a position of the carrier tape 306 (and thus, the pocket 304) along a first axis (X axis). The first positioning device 320 also includes a second full stroke unit 320b for adjusting a position of the carrier tape 306 along a second axis (Y axis) perpendicular to the first axis. The second positioning device 322 includes a first short stroke unit 322a for adjusting a position of the carrier tape 306 along the first axis (X axis) and a second short stroke unit 322b for adjusting a position of the carrier tape 306 along the second axis (Y axis).

The positioning devices 320, 322 are movable simultaneously and independently of each other. For instance, the first positioning device 320 may move in a first direction, carrying the second positioning device 322 in the first direction as well but at the same time, the second positioning device 322 may move, independently of the first positioning device 320, in a second direction opposite the first direction. The second positioning device 322 is configured to provide finer adjustments than the first positioning device and a weight of the first positioning device 320 is heavier than a weight of the second positioning device 322. As will be elaborated below, the first and second positioning devices 320, 322 are configured to move first and second portions of the apparatus 300 respectively, with the second portion comprised in and being a subset of the first portion. In other words, a weight of the first portion is heavier than a weight of the second portion.

Figure 4:
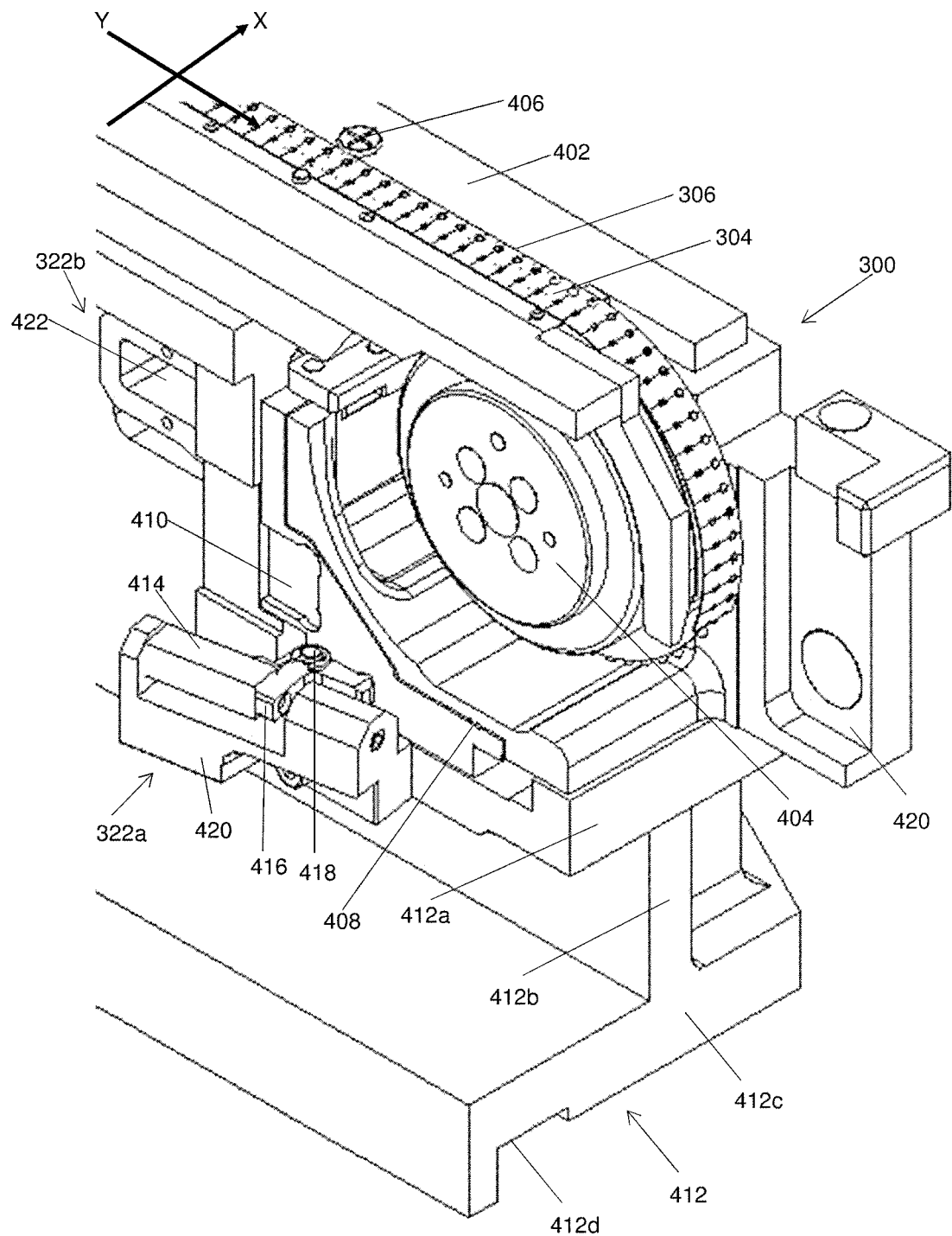
FIG. 4 shows a perspective view of a part of the apparatus of FIG. 3.
Figure 5:
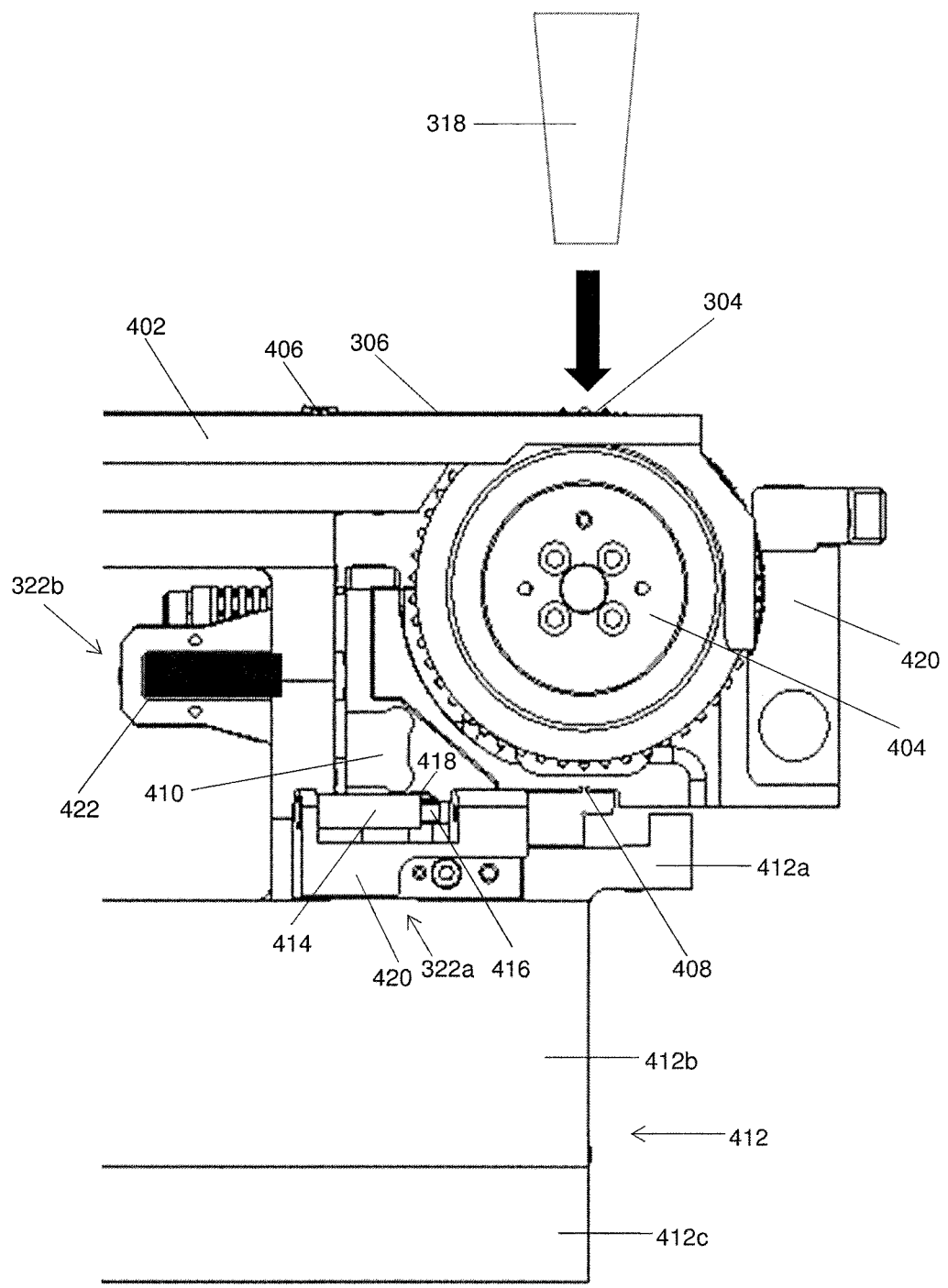
FIG. 5 shows a side view of the part of the apparatus of FIG. 4 and a down-look camera of the apparatus.

FIG. 4 is a perspective view of a part of the apparatus 300. FIG. 5 is a side view of the part of the apparatus 300 shown in FIG. 4 and the down-look camera 318.

Referring to FIG. 4 and FIG. 5, the apparatus 300 further comprises a first support structure 402 and a conveying mechanism in the form of an index wheel 404. The first support structure 402 cooperates with the index wheel 404 to support and convey the carrier tape 306. The index wheel 404 is driven by an index wheel motor (not shown in the figures) and is configured to rotate to convey the carrier tape 306 along a conveying axis (which coincides with the Y axis). The index wheel 404 includes a securing element in the form of a pin (not shown in FIG. 4 and FIG. 5) for securing the carrier tape 306 with respect to the index wheel 404. A guide 406 for guiding the carrier tape 306 along the Y axis is disposed on the first support structure 402. The positioning mechanism is coupled to the conveying mechanism as will be elaborated later.

Figure 6:
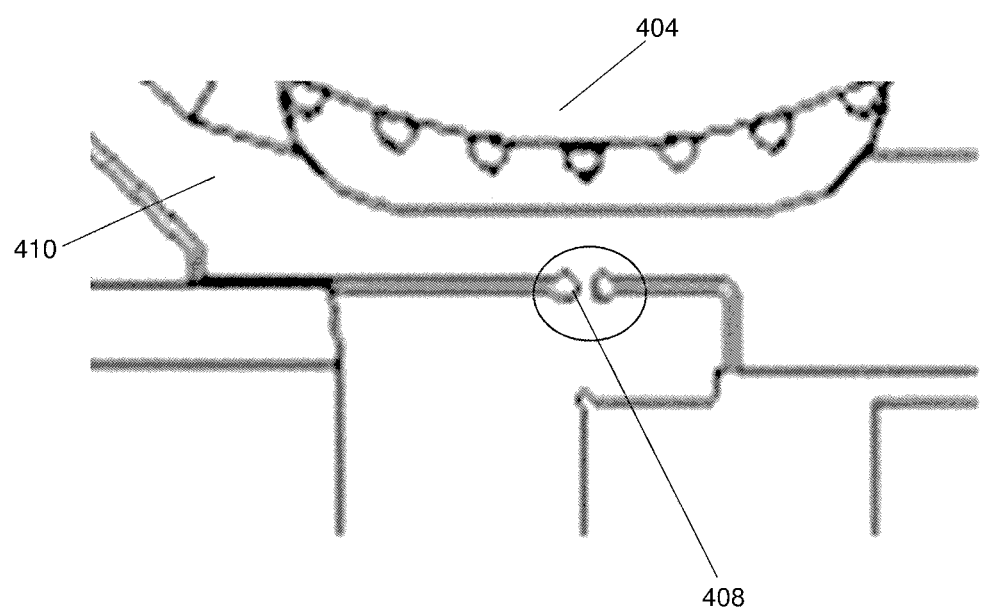
FIG. 6 shows a magnified view of a portion of the side view of FIG. 5.

The apparatus also comprises a second support structure configured to support the index wheel 404. The second support structure comprises a pivot in the form of a flexural pivot 408 and a support element 410. FIG. 6 will show a magnified view of the arrangement between the index wheel 404, the flexural pivot 408 and the support element 410. The index wheel 404 is supported on the flexural pivot 408, such that the index wheel 404 can swing about the flexural pivot 408 in a first rotational direction towards the turret 308 and in a second rotational direction away from the turret 308. The flexural pivot 408 is configured to urge the index wheel 404 towards the second rotational direction and the support element 410 supports the index wheel 404 against this by biasing the index wheel 404 in the first rotational direction. The index wheel 404 is hence balanced on the flexural pivot 408.

The apparatus 300 further comprises a third support structure 412 configured to support the second support structure. As more clearly shown in FIG. 4, the third support structure 412 includes a first base 412a immediately below the support element 410, a second base 412c a distance away from the first base 412a and an interconnecting element 412b between the first and second bases 412a, 412c. The second base 412c has a notch 412d for engagement with the first positioning device 320. The first positioning device 320 is configured to move the third support structure 412. Since the index wheel 404 (supporting the carrier tape 306) is supported by the second support structure which is in turn supported by the third support structure, movement of the third support structure by the first positioning device 320 also moves the carrier tape 306.

In addition, the apparatus 300 comprises a collection mechanism 420 for collecting the packed electronic devices 302. The carrier tape 306 is arranged with the index wheel 404 such that after the electronic device 302 is placed into the respective pocket 304, the index wheel 404 rotates to convey the carrier tape 306 towards the collection mechanism 420. The electronic device 302 in the respective pocket 304 i.e. the packed electronic device 302 is thus conveyed into and collected by the collection mechanism 420.

As described above, the second positioning device 322 comprises a first short stroke unit 322a for adjusting a position of the carrier tape 306 (hence, the pocket 304) along the X axis and a second short stroke unit 322b for adjusting a position of the carrier tape 306 along the Y axis. Specifically, the second positioning device 322 is configured to adjust a position of the index wheel 404 independently of the rest of the apparatus 300 and independently of the first positioning device 320. The second positioning device 322 will now be described in greater detail.

Referring to FIG. 4 and FIG. 5, the first short stroke unit 322a is connected to a side of the first base 412a of the third support structure 412. The second short stroke unit 322b is located behind the index wheel 404 and is connected to the support element 410, which is supported by the third support structure 412. Therefore, movement of the third support structure 412 by the first positioning device 320 through a distance carries the second positioning device 322 through the same distance.

Figure 7:
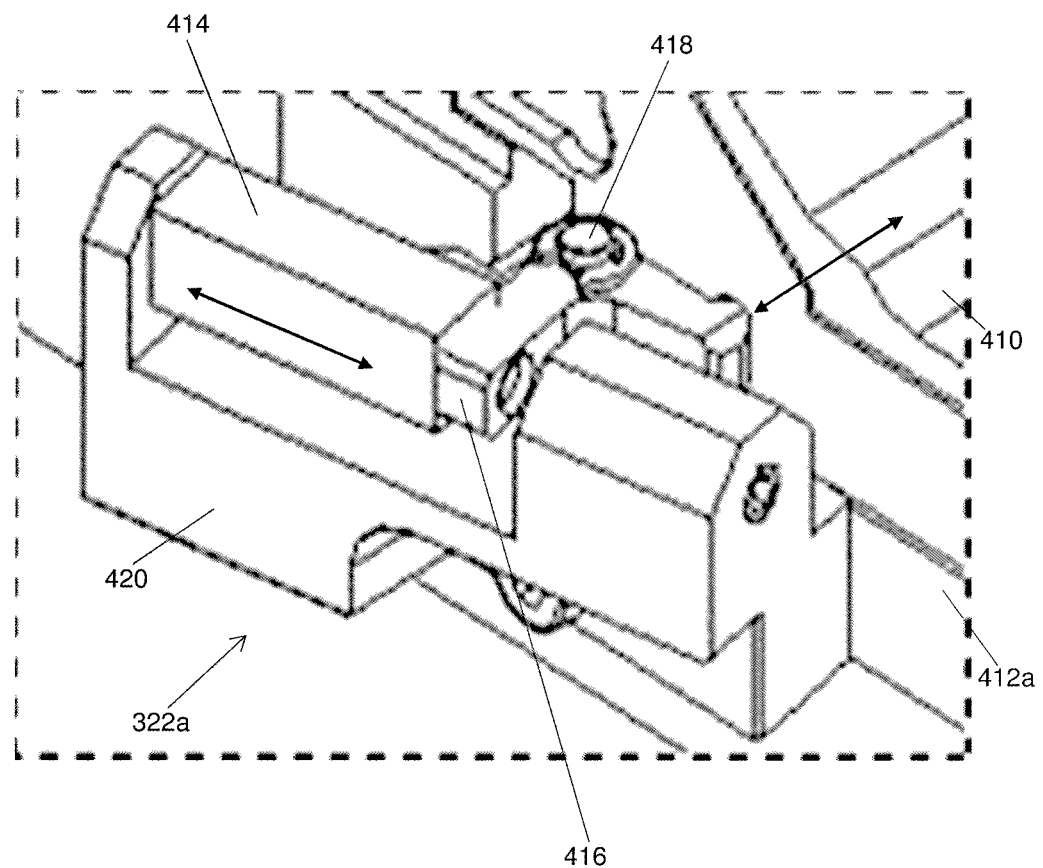
FIG. 7 shows a magnified view of a portion of the perspective view of FIG. 4.

FIG. 7 shows a magnified view of the first short stroke unit 322a. As more clearly shown in FIG. 7, the first short stroke unit 322a comprises a first actuator in the form of a short stroke X actuator 414, and a linkage having a linkage element 416 and a hinge 418. The linkage element 416 is rotatable about the hinge 418. The linkage element 416 includes first and second arms, which may be of equal length and substantially perpendicular to each other. The hinge 418 is located between the first and second arms. The first short stroke unit 322a also comprises an elongate support 420 for supporting the short stroke X actuator 414 and the linkage. The elongate support 420 is connected to the first base 412a of the third support structure 412, tilted at an angle with respect to a length of the first base 412a. The elongate support 420 includes an elongate recess with a length greater than a length of the short stroke X actuator 414. The short stroke X actuator 414 and a part of the first arm of the linkage element 416 are located within this recess. A length of the short stroke X actuator 414 lies parallel to a length of the recess, and a length of the first arm of the linkage element 416 lies perpendicular to the length of the short stroke X actuator 414. The short stroke X actuator 414 is connected at one end to the elongate support 420 and at the other end to the first arm of the linkage element 416. The second arm of the linkage element 416, perpendicular to the first arm, is connected to the support element 410. In other words, the linkage is connected between the short stroke X actuator 414 and the support element 410.

The short stroke X actuator 414 is configured to move the linkage element 416 to move the index wheel 404 along the X axis. To elaborate, the short stroke X actuator 414 is configured to extend and retract to rotate the linkage element 416 about the hinge 418 to move the support element 410, and in turn, the index wheel 404 along the X axis. In particular, when the linkage element 416 is rotated in an anti-clockwise direction (as seen from above), the index wheel 404 is moved away from the short stroke X actuator 414 and when the linkage element 416 is rotated in a clockwise direction (as seen from above), the index wheel 404 is moved towards the short stroke X actuator 414. The movement of the index wheel 404 along the X axis is guided by a guiding element in the form of a cross roller guide (not shown in the figures). As the index wheel 404 moves along the X axis, the carrier tape 306 carried by the index wheel 404 is moved in the X axis as well.

The second short stroke unit 322b comprises a second actuator in the form of a short stroke Y actuator 422 connected to the support element 410. The short stroke Y actuator 422 is configured to actuate the index wheel 404 to adjust a position of the pocket 304 along the Y axis.

As described above, the support element 410 and the flexural pivot 408 urge the index wheel 404 respectively in first and second directions opposite to each other, allowing the index wheel 404 to be balanced on the flexural pivot 408.

The short stroke Y actuator is configured to urge the index wheel 404 to swing about the flexural pivot 408 (which is supporting the index wheel 404) in the first rotational direction for adjusting a position of the respective pocket 304 along the Y axis. In particular, the short stroke Y actuator is configured to extend to urge the support element 410 in a first direction towards the index wheel 404. This in turn urges the index wheel 404 to swing about the flexural pivot 408 in the first rotational direction towards the turret 308. The index wheel 404 is thus actuated and the carrier tape 306 is conveyed in the first direction. In turn, the pocket 304 is moved towards the turret 308 along the Y axis. The short stroke Y actuator is further configured to retract to move the support element 410 away from the index wheel 404. This causes the index wheel 404 to swing about the flexural pivot 408 in a second rotational direction (opposite the first rotational direction) away from the turret 308 (due to the urging force towards the second rotational direction by the flexural pivot 308). The index wheel 404 is thus rotated and the carrier tape 306 is conveyed in the second direction. In turn, the pocket 304 is moved away from the turret 308 along the Y axis.

In use, the circular turret body 310 moves each pick head 312 to pick up an ultra-small electronic device 302. The pick head 312 holds the ultra-small electronic device 302 and the circular turret body 310 rotates to move the pick head 312 to the precising station and subsequently to the imaging station. At the precising station, an orientation of the electronic device 302 held by the pick head 312 is adjusted using the precisor re-orientator 314. At the imaging station, an image of the pick head 312 is captured by the up-look camera 316. This captured image shows a relative position of the electronic device 302 with respect to the pick head 312.

Next, the circular turret body 310 rotates to half of the pitch to position the down-look camera 318 above the carrier tape 306, specifically, at a position corresponding to the packing position. An image of the carrier tape 306 is then captured by the down-look camera 318. Prior to capturing this image, the index wheel 404 had rotated to convey a next pocket 304 (into which a next electronic device 302 is to be placed) to a receiving position corresponding to the packing position. Therefore, the image of the carrier tape 306 captured by the down-look camera 318 shows the next pocket 304.

An expected offset in position between the next electronic device 302 and the respective pocket 304 when the next pick head 312 is at the packing position is calculated by the processor of the apparatus 300. This calculation is done using the images captured by the up-look camera 316 and the down-look camera 318. The positioning mechanism comprising the first and second positioning devices 320, 322 then adjusts a position of the pocket 304 based on the calculated offset. In particular, the first positioning device 320 is for coarse positioning of the index wheel 404 and the second positioning device 322 mounted on the first positioning device 320 is for fine positioning of the index wheel 404. In other words, the second positioning device 322 is configured to position the index wheel 404 with greater precision than the first positioning device 320. If the calculated offset is greater than a predetermined threshold (for example, 0.03 mm), both the first positioning device 320 and the second positioning device 322 cooperate to adjust the position of the pocket 304. To elaborate, the first positioning device 320 moves the third support structure 412 to coarsely adjust the position of the pocket 304, and the second positioning device 322 moves the index wheel 404 to provide finer adjustments to the position of the pocket 304. The first and second positioning devices 320, 322 may move the third support structure 412 and the index wheel 404 simultaneously. Alternatively, either the third support structure 412 or the index wheel 404 may be moved before the other. If however, the offset is less than the predetermined threshold, the position of the pocket 304 is adjusted by only the second positioning device 322 but not the first positioning device 320. In other words, the index wheel 404 is moved only by the second positioning device 322.

The circular turret body 310 then rotates to move the next pick head 312 to the packing position at which the electronic device 302 held by the next pick head 312 will be placed into the respective pocket 304. FIG. 8A-FIG. 8F show magnified views of a part of the apparatus 300 at different steps of placing the electronic device 302 into the pocket 304. In particular, FIG. 8A-FIG. 8F show the carrier tape with pockets 304a, 304b, 304c. Referring to FIG. 8A, a previous electronic device (ED) 302a has been placed into a previous pocket 304a. The next pick head 312b holding the electronic device 302b is at the packing position and the respective pocket 304b is below the pick head 312b in a receiving position after adjustment of its position by the positioning mechanism. Referring to FIG. 8B-FIG. 8C, the movement mechanism of the apparatus 300 moves the pick head 312b downwards from a first position to a second position to place the electronic device 302b into the pocket 304b. The placement of the electronic device 302b into the pocket 304b is free of error because of the improved alignment between the electronic device 302b and the pocket 304b. Referring to FIG. 8D, while the pick head 312b remains in the second position, the index wheel 404 rotates and conveys the carrier tape 306 towards the turret 308 to bring a next pocket 304c to a receiving position corresponding to the packing position. This rotation of the index wheel 404 urges the electronic device 302b away from the pick head 312b. The electronic device 302b is thus removed from the pick head 312b while remaining in the pocket 304b. Referring to FIG. 8E, the pick head 312b then retracts to the first position. In FIG. 8E, the next pocket 304c is at a receiving position corresponding to the packing position before adjustment of its position by the positioning mechanism. FIG. 8F shows a next pick head 312c holding an electronic device 302c at the packing position and the pocket 304c after adjustment of its position. The processes shown in FIG. 8A-FIG. 8E are repeated for this electronic device 302c. FIG. 9A-FIG. 9F correspond respectively to FIG. 8A-FIG. 8F and show photos of the pick heads 312b, 312c, the carrier tape 306 and the electronic devices 302a, 302b, 302c captured by a high-speed camera.

The index wheel 404 then further rotates to convey the carrier tape 406 towards the turret 308, so that the pockets 304 comprising the electronic devices 302 are moved into the collection mechanism. The packed electronic devices 302 (in other words, the electronic devices 302 in the respective pockets 304) are thereafter collected in the collection mechanism.

Various modifications may be made to the above-described embodiments.

For example, the precising mechanism need not be present. Similarly, the imaging mechanism and the processor need not be present. Instead, the adjustment of the relative position between each electronic device 302 and the respective pocket 304 may be performed based on a predetermined offset or an offset calculated via other methods.

The first and second positioning devices 320, 322 need not be movable simultaneously and independently of each other. Either one of the positioning devices 320, 322 may be configured to move before the other. The second positioning device 322 also need not be lighter in weight than the first positioning device 320. As long as the second positioning device 322 is configured to provide finer adjustments than the first positioning device 320, the time taken for the adjustments in the relative positions between the electronic devices 302 and the respective pockets 304 can be reduced. Similarly, the first and second positioning devices 320, 322 may adjust the same portion of the apparatus 300.

Further, one or both of the linkage element 416 and the support element 410 may be absent from the apparatus 300. Instead, the short stroke X actuator 414 may be connected directly to the index wheel 404 to move the wheel 404 along the X axis. The short stroke Y actuator 422 may also be connected directly to the index wheel 404 to move the wheel 404 along the Y axis.

Also, the actuators 414, 422 may be implemented using different types of actuators. For example, the short stroke X actuator 414 may be in the form of a piezo actuator. Similarly, the flexural pivot 408 may be replaced by other types of pivots which are capable of supporting the index wheel 404 in the same manner.

Furthermore, the operation of the apparatus 300 may differ from that described above. The order of the steps may be changed and some steps may be performed simultaneously. For example, the placement of the electronic device 302 into the pocket 304 need not begin only after the position of the pocket 304 is fully adjusted. Instead, the pick head 312 may begin moving downwards towards the pocket 304 while the positioning mechanism is adjusting the position of the pocket 304.

The invention claimed is:

1. An apparatus for placing ultra-small electronic devices into pockets on a carrier tape for packing, the apparatus comprising:
    at least one holding element configured to hold an electronic device;
    a movement mechanism configured to move each holding element to pick up the electronic device and to place the electronic device into a respective pocket on the carrier tape;
    a conveying mechanism configured to support and convey the carrier tape to move each pocket to a receiving position, where the electronic device is placed by the at least one holding element into a respective pocket located at the receiving position; and
    a positioning mechanism coupled to the conveying mechanism, the positioning mechanism being operative to adjust a relative position between each electronic device and the respective pocket by adjusting the carrier tape prior to placing the electronic device into the respective pocket;
    wherein the positioning mechanism comprises a first positioning device for coarse positioning of the conveying mechanism and a second positioning device mounted on the first positioning device for fine positioning of the conveying mechanism, the second positioning device being configured to position the conveying mechanism with greater precision than the first positioning device.

2. The apparatus according to claim 1, wherein the first and second positioning devices are movable simultaneously and independently of each other.

3. The apparatus according to claim 1, wherein a weight of the first positioning device is heavier than a weight of the second positioning device.

4. The apparatus according to claim 1, wherein the second positioning device is configured to adjust a position of the conveying mechanism independently of the first positioning device.

5. The apparatus according to claim 1, wherein the first and second positioning devices are configured to move first and second portions of the apparatus, a weight of the first portion being heavier than a weight of the second portion.

6. The apparatus according to claim 5, wherein the second portion is comprised in and is a subset of the first portion.

7. The apparatus according to claim 1, further comprising:
an imaging system configured to capture an image of each holding element and an image of each pocket; and
a processor operative to calculate an offset between each pocket and the respective electronic device using the captured images;
wherein the positioning mechanism is configured to adjust a position of each pocket relative to the respective electronic device based on the calculated offset between the pocket and the respective electronic device.

8. The apparatus according to claim 7, wherein if the processor determines that the offset is less than a predetermined threshold, only the second positioning device but not the first positioning device is operative to adjust the position of the pocket relative to the respective electronic device.

9. The apparatus according to claim 1, wherein the second positioning device comprises a first actuator configured to move the conveying mechanism along an axis perpendicular to the conveying axis.

10. The apparatus according to claim 9, wherein the second positioning device further comprises a linkage, and the first actuator is configured to move the linkage to move the conveying mechanism along the axis perpendicular to the conveying axis.

11. The apparatus according to claim 10, wherein the linkage comprises a linkage element and a hinge, and wherein the first actuator is configured to rotate the linkage element about the hinge to move the conveying mechanism.

12. The apparatus according to claim 9, wherein the second positioning device comprises a second actuator operative to actuate the conveying mechanism for adjusting a position of the respective pocket along the conveying axis.

13. The apparatus according to claim 12, wherein the apparatus further comprises a pivot configured to support the conveying mechanism when the second actuator urges the conveying mechanism to swing about the pivot in a first rotational direction for adjusting a position of the respective pocket along the conveying axis.

14. The apparatus according to claim 13, wherein the apparatus further comprises a support element for biasing the conveying mechanism in the first rotational direction, and the second actuator is operative to move the support element away from the conveying mechanism to cause the conveying mechanism to swing about the pivot in a second rotational direction opposite to the first rotational direction.

* * * * *